(12) United States Patent
Toida

(10) Patent No.: US 11,119,421 B2
(45) Date of Patent: Sep. 14, 2021

(54) EXTREME ULTRAVIOLET LIGHT CONDENSATION MIRROR, EXTREME ULTRAVIOLET LIGHT GENERATION APPARATUS, AND ELECTRONIC DEVICE MANUFACTURING METHOD

(71) Applicant: Gigaphoton Inc., Tochigi (JP)

(72) Inventor: Tomoyoshi Toida, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 17/004,608

(22) Filed: Aug. 27, 2020

(65) Prior Publication Data

US 2021/0124275 A1 Apr. 29, 2021

(30) Foreign Application Priority Data

Oct. 29, 2019 (JP) .............................. JP2019-196669

(51) Int. Cl.
*G03F 7/20* (2006.01)
*H05G 2/00* (2006.01)

(52) U.S. Cl.
CPC ...... *G03F 7/70958* (2013.01); *G03F 7/70025* (2013.01); *G03F 7/70033* (2013.01); *G03F 7/70316* (2013.01); *H05G 2/008* (2013.01)

(58) Field of Classification Search
CPC .. G03F 7/70025; G03F 7/70033; G03F 7/702; G03F 7/70233; G03F 7/70316; G03F 7/70958; H05G 2/00–008
USPC ........... 250/504 R; 355/67, 71; 359/359, 360
See application file for complete search history.

(56) References Cited

U.S. PATENT DOCUMENTS

| | | | | |
|---|---|---|---|---|
| 7,060,993 B2 * | 6/2006 | Wedowski | ............ | B08B 7/0035 134/1 |
| 2004/0253426 A1 * | 12/2004 | Yakshin | ............... | G03F 7/70958 428/212 |
| 2006/0066940 A1 * | 3/2006 | Trenkler | ............. | G03F 7/70958 359/359 |
| 2010/0239822 A1 * | 9/2010 | Pelizzo | ................ | G02B 5/0891 428/172 |
| 2015/0316851 A1 | 11/2015 | Wabra et al. | | |

FOREIGN PATENT DOCUMENTS

JP   2008-288299 A   11/2008

* cited by examiner

*Primary Examiner* — Colin W Kreutzer
(74) *Attorney, Agent, or Firm* — Studebaker & Brackett PC

(57) ABSTRACT

An extreme ultraviolet light condensation mirror includes: a substrate; a multi-layer reflective film on the substrate and configured to reflect extreme ultraviolet light having a wavelength of 13.5 nm; and a protective film on the multi-layer reflective film. The protective film includes an oxide silicon layer on the multi-layer reflective film and a titanium oxide layer on the oxide silicon layer having one surface exposed. When x represents the thickness of the titanium oxide layer, the phase of standing wave of the extreme ultraviolet light at the position of the one surface for the maximum reflectance of the extreme ultraviolet light is defined to be zero, and a direction from the one surface toward the multi-layer reflective film is defined to be negative, the position of the one surface is a position at which the phase y of standing wave satisfies the expression below.

$-0.313x^3 + 1.44x^2 + 2.57x - 51.0 \le y < 0$.

13 Claims, 8 Drawing Sheets

EXTREME ULTRAVIOLET LIGHT CONDENSATION MIRROR, EXTREME ULTRAVIOLET LIGHT GENERATION APPARATUS, AND ELECTRONIC DEVICE MANUFACTURING METHOD

CROSS-REFERENCE TO RELATED APPLICATIONS

The present application claims the benefit of Japanese Patent Application No. 2019-196669, filed on Oct. 29, 2019, the entire contents of which are hereby incorporated by reference.

BACKGROUND

1. Technical Field

The present disclosure relates to an extreme ultraviolet light condensation mirror, an extreme ultraviolet light generation apparatus, and an electronic device manufacturing method.

2. Related Art

Recently, miniaturization of a transfer pattern in optical lithography of a semiconductor process has been rapidly proceeding along with miniaturization of the semiconductor process. Minute fabrication at 20 nm or smaller will be requested in the next generation technology. To meet the request for minute fabrication at 20 nm or smaller, for example, it is desired to develop an exposure device including an extreme ultraviolet light generation apparatus configured to generate extreme ultraviolet (EUV) light at a wavelength of 13 nm approximately in combination with reduced projection reflective optics.

Disclosed EUV light generation devices include three kinds of devices of a laser produced plasma (LPP) device that uses plasma generated by irradiating a target material with a laser beam, a discharge produced plasma (DPP) device that uses plasma generated by electrical discharge, and a synchrotron radiation (SR) device that uses synchrotron radiation.

LIST OF DOCUMENTS

Patent Documents

Patent Document 1: US Published Patent Application No. 2015/0316851
Patent Document 2: Japanese Unexamined Patent Application Publication No. 2008-288299

SUMMARY

An extreme ultraviolet light condensation mirror according to an aspect of the present disclosure may include: a substrate; a multi-layer reflective film provided on the substrate and configured to reflect extreme ultraviolet light having a wavelength of 13.5 nm; and a protective film provided on the multi-layer reflective film. The protective film may include an oxide silicon layer provided on the multi-layer reflective film, and a titanium oxide layer that is provided on the oxide silicon layer and one surface of which is exposed. When x represents a thickness of the titanium oxide layer, a phase of standing wave of the extreme ultraviolet light at the position of the one surface at time of a reflectance of the extreme ultraviolet light being maximum is defined to be zero, and a direction from the one surface toward the multi-layer reflective film is defined to be negative, a position of the one surface may be a position at which the phase of standing wave, which is represented by y, satisfies an expression below.

$$-0.313x^3+1.44x^2+2.57x-51.0 \leq y < 0$$

An extreme ultraviolet light generation apparatus according to an aspect of the present disclosure may include: a chamber having an internal space in which a laser beam is condensed and plasma is generated from a target substance at a focusing position of the laser beam; and an extreme ultraviolet light condensation mirror configured to condense extreme ultraviolet light radiated from the plasma of the target substance. The extreme ultraviolet light condensation mirror may include: a substrate; a multi-layer reflective film provided on the substrate and configured to reflect extreme ultraviolet light having a wavelength of 13.5 nm; and a protective film provided on the multi-layer reflective film. The protective film may include an oxide silicon layer provided on the multi-layer reflective film, and a titanium oxide layer that is provided on the oxide silicon layer and one surface of which is exposed. When x represents a thickness of the titanium oxide layer, a phase of standing wave of the extreme ultraviolet light at the position of the one surface at time of a reflectance of the extreme ultraviolet light being maximum is defined to be zero, and a direction from the one surface toward the multi-layer reflective film is defined to be negative, a position of the one surface may be a position at which the phase of standing wave, which is represented by y, satisfies an expression below.

$$-0.313x^3+1.44x^2+2.57x-51.0 \leq y < 0$$

An electronic device manufacturing method according to an aspect of the present disclosure may include: generating extreme ultraviolet light by an extreme ultraviolet light generation apparatus; outputting the extreme ultraviolet light to an exposure apparatus; and exposing a photosensitive substrate to the extreme ultraviolet light in the exposure apparatus to manufacture an electronic device. The extreme ultraviolet light generation apparatus may include: a chamber having an internal space in which a laser beam is condensed and plasma is generated from a target substance at a focusing position of the laser beam; and an extreme ultraviolet light condensation mirror configured to condense extreme ultraviolet light radiated from the plasma of the target substance. The extreme ultraviolet light condensation mirror may include: a substrate; a multi-layer reflective film provided on the substrate and configured to reflect extreme ultraviolet light having a wavelength of 13.5 nm; and a protective film provided on the multi-layer reflective film. The protective film may include an oxide silicon layer provided on the multi-layer reflective film, and a titanium oxide layer that is provided on the oxide silicon layer and one surface of which is exposed. When x represents a thickness of the titanium oxide layer, a phase of standing wave of the extreme ultraviolet light at the position of the one surface at time of a reflectance of the extreme ultraviolet light being maximum is defined to be zero, and a direction from the one surface toward the multi-layer reflective film is defined to be negative, a position of the one surface may be a position at which the phase of standing wave, which is represented by y, satisfies an expression below.

$-0.313x^3+1.44x^2+2.57x-51.0 \le y < 0$

BRIEF DESCRIPTION OF THE DRAWINGS

Embodiments of the present disclosure will be described below as examples with reference to the accompanying drawings.

DESCRIPTION OF EMBODIMENTS

1. Overview
2. Description of electronic device manufacturing device
3. Description of extreme ultraviolet light generation apparatus
   3.1 Configuration
   3.2 Operation
4. Description of EUV light condensation mirror of comparative example
   4.1 Configuration
   4.2 Problem
5. Description of EUV light condensation mirror of Embodiment 1
   5.1 Configuration
   5.2 Effect An embodiment of the present disclosure will be described below in detail with reference to the accompanying drawings.

The embodiment described below is an example of the present disclosure, and does not limit the contents of the present disclosure. Not all configurations and operations described in the embodiment are necessarily essential as configurations and operations of the present disclosure. Components identical to each other are denoted by an identical reference sign, and duplicate description thereof will be omitted.

1. Overview

The embodiment of the present disclosure relates to an extreme ultraviolet light generation apparatus configured to generate light having a wavelength corresponding to so-called extreme ultraviolet light and an electronic device manufacturing apparatus. Hereinafter, extreme ultraviolet light is also referred to as EUV light.

2. Description of Electronic Device Manufacturing Apparatus

Figure 1:
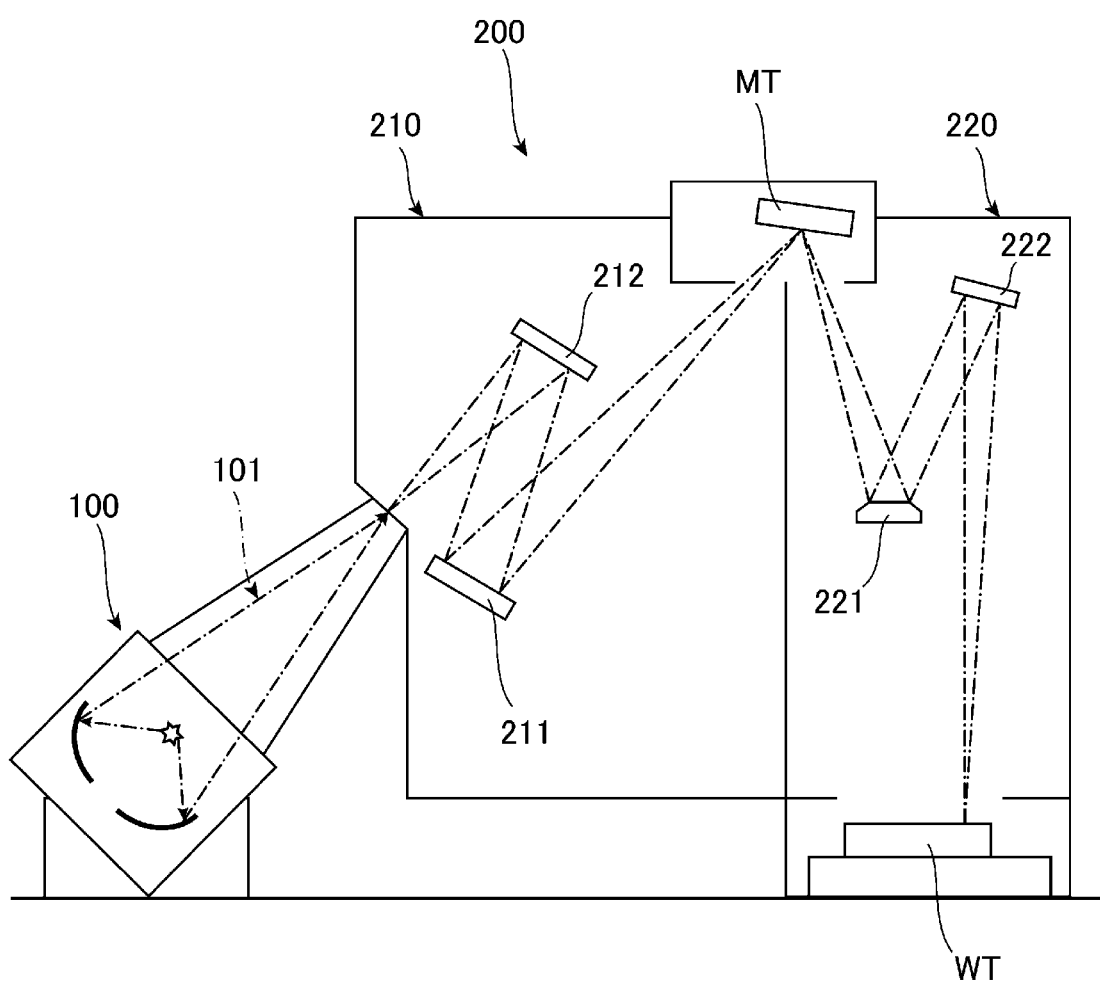
FIG. 1 is a pattern diagram illustrating an exemplary entire schematic configuration of an electronic device manufacturing device.

As illustrated in FIG. 1, the electronic device manufacturing apparatus includes an EUV light generation apparatus 100 and an exposure apparatus 200. The exposure apparatus 200 includes a mask irradiation unit 210 including a plurality of mirrors 211 and 212, and a workpiece irradiation unit 220 including a plurality of mirrors 221 and 222. The mask irradiation unit 210 illuminates, with EUV light 101 incident from the EUV light generation apparatus 100, a mask pattern on a mask table MT through a reflection optical system. The workpiece irradiation unit 220 images, through a reflection optical system, the EUV light 101 reflected by the mask table MT on a workpiece (not illustrated) disposed on a workpiece table WT. The workpiece is a photosensitive substrate such as a semiconductor wafer on which photoresist is applied. The exposure apparatus 200 translates the mask table MT and the workpiece table WT in synchronization with each other to expose the workpiece to the EUV light 101 with the mask pattern reflected. Through an exposure process as described above, a device pattern is transferred onto the semiconductor wafer, thereby manufacturing a semiconductor device.

Figure 2:
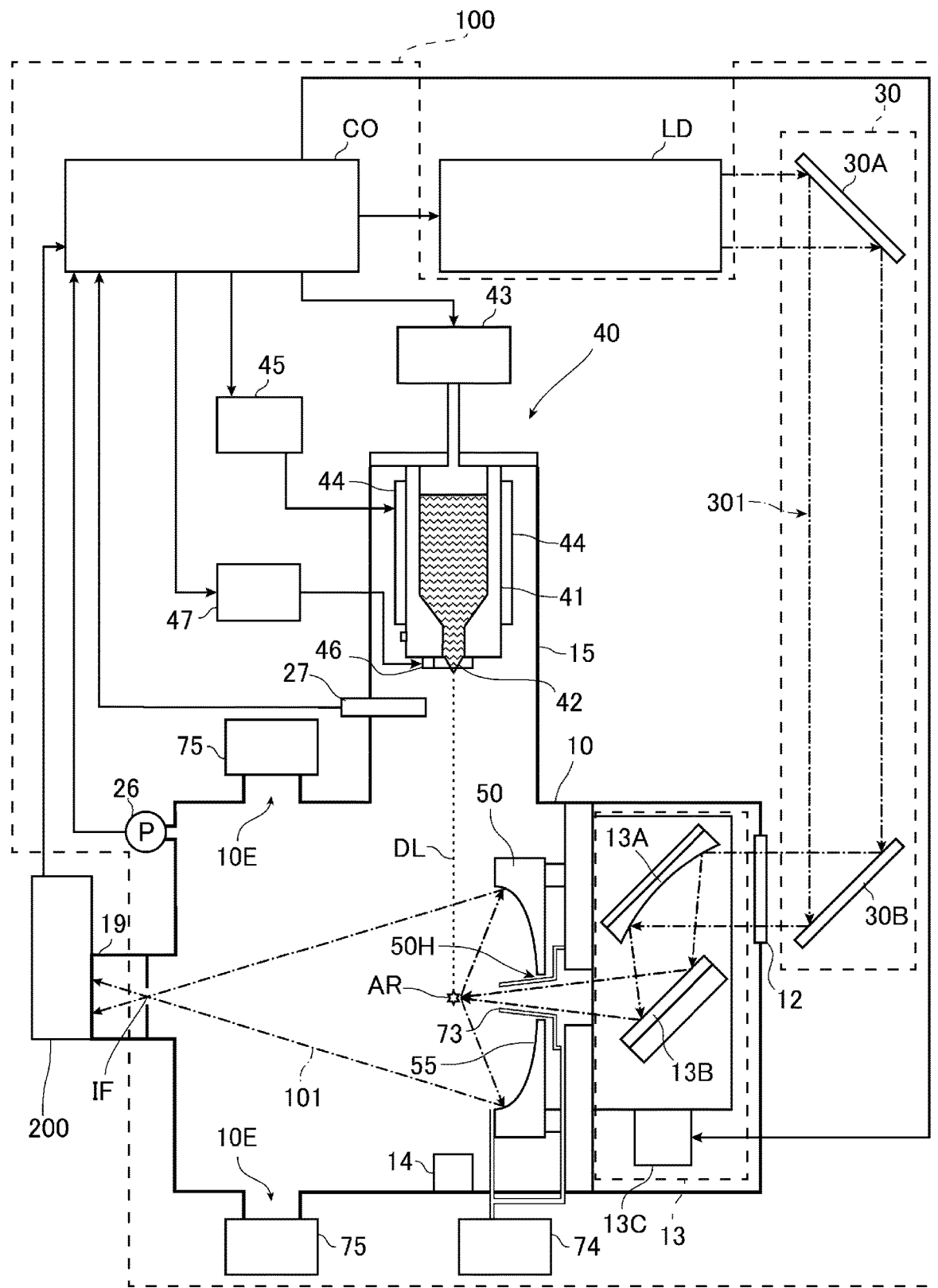
FIG. 2 is a pattern diagram illustrating an exemplary entire schematic configuration of an extreme ultraviolet light generation apparatus.

3. Description of Extreme Ultraviolet Light Generation Apparatus 3.1 Configuration The following describes an extreme ultraviolet light generation apparatus. FIG. 2 is a pattern diagram illustrating an exemplary entire schematic configuration of the extreme ultraviolet light generation apparatus 100 of the present example. As illustrated in FIG. 2, the EUV light generation apparatus 100 of the present embodiment is connected with a laser apparatus LD. The EUV light generation apparatus 100 of the present embodiment includes a chamber device 10, a control unit CO, and a laser beam delivery optical system 30 as main components.

The chamber device 10 is a sealable container. The chamber device 10 includes a sub chamber 15 provided with a target supply unit 40. The target supply unit 40 includes a tank 41 and a nozzle 42. The target supply unit 40 supplies a droplet DL to the internal space of the chamber device 10 and is attached to, for example, penetrate through the wall of the sub chamber 15. The droplet DL, which is also called a target, is supplied from the target supply unit 40.

The tank 41 stores inside a target substance that becomes the droplet DL. The target substance contains tin. The inside of the tank 41 is communicated with, through a pipe, a pressure adjuster 43 configured to adjust gas pressure. In addition, a heater 44 is attached to the tank 41. The heater 44 heats the tank 41 by current supplied from a heater power source 45. Through the heating, the target substance in the tank 41 melts. The pressure adjuster 43 and the heater power source 45 are electrically connected with the control unit CO.

The nozzle 42 is attached to the tank 41 and discharges the target substance. A piezoelectric element 46 is attached to the nozzle 42. The piezoelectric element 46 is electrically connected with a piezoelectric power source 47 and driven by voltage applied from the piezoelectric power source 47. The piezoelectric power source 47 is electrically connected with the control unit CO. The target substance discharged from the nozzle 42 is formed into the droplet DL through operation of the piezoelectric element 46.

In addition, the chamber device 10 includes a target collection unit 14. The target collection unit 14 collects any unnecessary droplet DL.

The wall of the chamber device 10 is provided with at least one through-hole. The through-hole is blocked by a window 12 through which a laser beam 301 emitted in pulses from the laser apparatus LD transmits.

In addition, a laser condensation optical system 13 is disposed in the chamber device 10. The laser condensation optical system 13 includes a laser beam condensation mirror 13A and a high reflectance mirror 13B. The laser beam condensation mirror 13A reflects and condenses the laser beam 301 transmitting through the window 12. The high reflectance mirror 13B reflects the light condensed by the laser beam condensation mirror 13A. The positions of the laser beam condensation mirror 13A and the high reflectance mirror 13B are adjusted by a laser beam manipulator 13C so that a laser focusing position in the chamber device 10 coincides with a position specified by the control unit CO.

An EUV light condensation mirror 50 having a substantially spheroidal reflective surface 55 is disposed inside the chamber device 10. The EUV light condensation mirror 50 reflects EUV light and has first and second focal points for the EUV light. The EUV light condensation mirror 50 is disposed so that, for example, the first focal point is positioned in a plasma generation region AR and the second focal point is positioned at an intermediate focus point IF. A through-hole 50H is provided at a central part of the EUV light condensation mirror 50, and the laser beam 301 in pulses passes through the through-hole 50H.

Further, the EUV light generation apparatus 100 includes a connection unit 19 that provides communication between the internal space of the chamber device 10 and the internal space of the exposure apparatus 200. The connection unit 19 includes a wall through which an aperture is formed. The wall is preferably disposed so that the aperture is positioned at the second focal point of the EUV light condensation mirror 50.

In addition, the EUV light generation apparatus 100 includes a pressure sensor 26. The pressure sensor 26 measures the pressure in the internal space of the chamber device 10. The EUV light generation apparatus 100 also includes a target sensor 27 attached to the chamber device 10. The target sensor 27 has, for example, an image capturing function and detects the existence, trajectory, position, speed, and the like of the droplet DL. The pressure sensor 26 and the target sensor 27 are electrically connected with the control unit CO.

The laser apparatus LD includes a master oscillator as a light source configured to perform burst operation. The master oscillator emits the laser beam 301 in pulses in a burst-on duration. The master oscillator is a $CO_2$ laser apparatus configured to emit a laser beam having a wavelength of 10.6 μm by exciting, through electrical discharging, gas as mixture of carbon dioxide gas with helium, nitrogen, or the like. The master oscillator may emit the laser beam 301 in pulses by a Q switch scheme. The master oscillator may include a light switch, a polarizer, and the like. In the burst operation, the laser beam 301 is emitted in continuous pulses at a predetermined repetition frequency in a burst on duration and the emission of the laser beam 301 is stopped in a burst off duration.

The traveling direction of the laser beam 301 emitted from the laser apparatus LD is adjusted by the laser beam delivery optical system 30. The laser beam delivery optical system 30 includes a plurality of mirrors 30A and 30B for adjusting the traveling direction of the laser beam 301, and the position of at least one of the mirrors 30A and 30B is adjusted by an actuator (not illustrated). Through this adjustment of the position of at least one of the mirrors 30A and 30B, the laser beam 301 may propagate into the chamber device 10 through the window 12 appropriately.

The control unit CO may be, for example, a micro controller, an integrated circuit (IC) such as a large-scale integrated circuit (LSI) or an application specific integrated circuit (ASIC), or a numerical control (NC) device. When the control unit CO is a NC device, the control unit CO may or may not include a machine learning device. The control unit CO controls the entire EUV light generation apparatus 100 and also controls the laser apparatus LD. The control unit CO receives a signal related to the pressure in the internal space of the chamber device 10, which is measured by the pressure sensor 26, a signal related to image data of the droplet DL captured by the target sensor 27, a burst signal from the exposure apparatus 200, and the like. The control unit CO processes the image data and the like and controls the output timing of the droplet DL, the output direction of the droplet DL, and the like.

In addition, a gas supply unit 73 configured to supply etching gas to the internal space of the chamber device 10 is disposed in the chamber device 10. The gas supply unit 73 is connected with a gas supply tank 74 configured to supply the etching gas through a pipe. Since the target substance contains tin as described above, the etching gas is, for example, balance gas having a hydrogen gas concentration of 3% approximately. The balance gas may contain nitrogen ($N_2$) gas or argon (Ar) gas. The pipe between the gas supply unit 73 and the gas supply tank 74 may be provided with a supply gas flow amount adjustment unit (not illustrated).

The gas supply unit 73 has the shape of the side surface of a circular truncated cone and is called a cone in some cases. A gas supply inlet of the gas supply unit 73 is inserted into the through-hole 50H provided at the EUV light condensation mirror 50, and the gas supply unit 73 supplies the etching gas through the through-hole 50H in a direction departing from the EUV light condensation mirror 50. The laser beam 301 passes through the through-hole 50H of the EUV light condensation mirror 50 as described above through the gas supply unit 73. Accordingly, the gas supply unit 73 has a configuration through which the laser beam 301 can transmit on the window 12 side.

Tin fine particles and tin charged particles are generated when plasma is generated from the target substance forming the droplet DL in the plasma generation region AR. The etching gas supplied from the gas supply unit 73 contains hydrogen that reacts with tin contained in these fine particles and charged particles. Through the reaction with hydrogen, tin becomes stannane ($SnH_4$) gas at room temperature.

In addition, the chamber device 10 is provided with a pair of discharge ports 10E. The discharge ports 10E are provided, for example, at positions facing each other on the wall of the chamber device 10. Residual gas contains tin fine particles and tin charged particles generated through the plasma generation from the target substance, stannane generated through reaction of the tin fine particles and tin charged particles with the etching gas, and unreacted etching gas. Some of the charged particles are neutralized in the chamber device 10, and the residual gas contains the neutralized charged particles as well. Each discharge port 10E through which the residual gas is discharged is connected with a discharge pipe, and the discharge pipe is connected with an exhaust device 75. Thus, the residual gas discharged from each discharge port 10E flows into the exhaust device 75 through the discharge pipe.

3.2 Operation

In the EUV light generation apparatus 100, an atmosphere in the chamber device 10 is discharged, for example, at new installation or maintenance. In this process, purge and discharge may be repeated in the chamber device 10 to discharge components in the atmosphere. Purge gas is preferably inert gas such as nitrogen ($N_2$) or argon (Ar). When the pressure in the chamber device 10 becomes equal to or smaller than a predetermined pressure after the atmosphere in the chamber device 10 is discharged, the control unit CO starts introduction of the etching gas from the gas supply unit 73 into the chamber device 10. In this case, the control unit CO may control a flow rate adjuster (not illustrated) while discharging gas in the internal space of the chamber device 10 to the exhaust device 75 through the discharge ports 10E so that the pressure in the internal space of the chamber device 10 is maintained at the predetermined pressure. The control unit CO maintains the pressure of the internal space of the chamber device 10 substantially constant based on the signal related to the pressure in the internal space of the chamber device 10, which is measured by the pressure sensor 26. In this case, the pressure of the internal space of the chamber device 10 is, for example, 10 Pa to 80 Pa.

The control unit CO supplies current from the heater power source 45 to the heater 44 to increase the temperature of the heater 44 so that the target substance in the tank 41 is heated to a predetermined temperature equal to or higher than the melting point. Thereafter, the control unit CO controls the temperature of the target substance to the predetermined temperature by adjusting the amount of current supplied from the heater power source 45 to the heater 44 based on an output from a temperature sensor (not illustrated). The predetermined temperature is, for example, in a range of 250° C. to 290° C. when the target substance is tin.

The control unit CO controls the pressure adjuster 43 to adjust the pressure in the tank 41 so that the target substance being melted is output at a predetermined speed through a nozzle hole of the nozzle 42. The target substance discharged through the hole of the nozzle 42 may be in the form of jet. In this case, the control unit CO generates the droplet DL by applying voltage having a predetermined waveform from the piezoelectric power source 47 to the piezoelectric element 46. Vibration of the piezoelectric element 46 can propagate through the nozzle 42 to the jet of the target substance output from the hole of the nozzle 42. The jet of the target substance is divided in a predetermined period by the vibration, and accordingly, the droplet DL is generated from the target substance.

The control unit CO outputs a light emission trigger to the laser apparatus LD. Having received the light emission trigger, the laser apparatus LD emits the laser beam 301 having a wavelength of, for example, 10.6 μm in pulses. The emitted laser beam 301 is incident on the laser condensation optical system 13 through the laser beam delivery optical system 30 and the window 12. In this case, the control unit CO controls the laser beam manipulator 13C of the laser condensation optical system 13 so that the laser beam 301 condenses in the plasma generation region AR. In addition, the control unit CO controls the laser apparatus LD to emit the laser beam 301 based on a signal from the target sensor 27 so that the droplet DL is irradiated with the laser beam 301. Accordingly, the droplet DL is irradiated in the plasma generation region AR with the laser beam 301 converged by the laser beam condensation mirror 13A. Plasma generated through the irradiation radiates light including EUV light having a wavelength of 13.5 nm.

Among the light generated in the plasma generation region AR and including the EUV light, the EUV light 101 is reflected by the EUV light condensation mirror 50 and condensed to the intermediate focus point IF and then incident on the exposure apparatus 200. Part of the laser beam 301 with which the droplet DL is irradiated is reflected by the droplet DL, and part of the reflected light is diffracted by the EUV light condensation mirror 50. The diffraction will be described later in detail.

When plasma is generated from the target substance, charged fine particles and electrically neutral fine particles are generated as described above. Some of these fine particles flow into the discharge ports 10E. For example, a magnetic field generation unit (not illustrated) or the like may be provided to generate a magnetic field by which the charged fine particles generated in the plasma generation region AR are converged to the discharge ports 10E. In this case, each charged fine particle receives Lorentz force from the magnetic field and is induced to the discharge ports 10E while converging on a helical trajectory along a magnetic field line, and most of the charged fine particles flow into the discharge ports 10E. Some other fine particles diffused in the chamber device 10 adhere to a reflective surface 55 of the EUV light condensation mirror 50. Some of the fine particles adhering to the reflective surface 55 become a predetermined product through reaction with the etching gas supplied from the gas supply unit 73. When the target substance is tin and the etching gas contains hydrogen as described above, the product is stannane gas at room temperature. The product obtained through reaction with the etching gas flows into the discharge ports 10E on flow of unreacted etching gas. The fine particles and the residual gas having flowed into the discharge ports 10E are provided with predetermined discharge treatment such as detoxification at the exhaust device 75.

4. Description of EUV Light Condensation Mirror of Comparative Example

The following describes the EUV light condensation mirror 50 of a comparative example in the extreme ultraviolet light generation apparatus 100. A component identical to that described above is denoted by an identical reference sign, and duplicate description thereof will be omitted unless specifically stated.

4.1 Configuration

Figure 3:
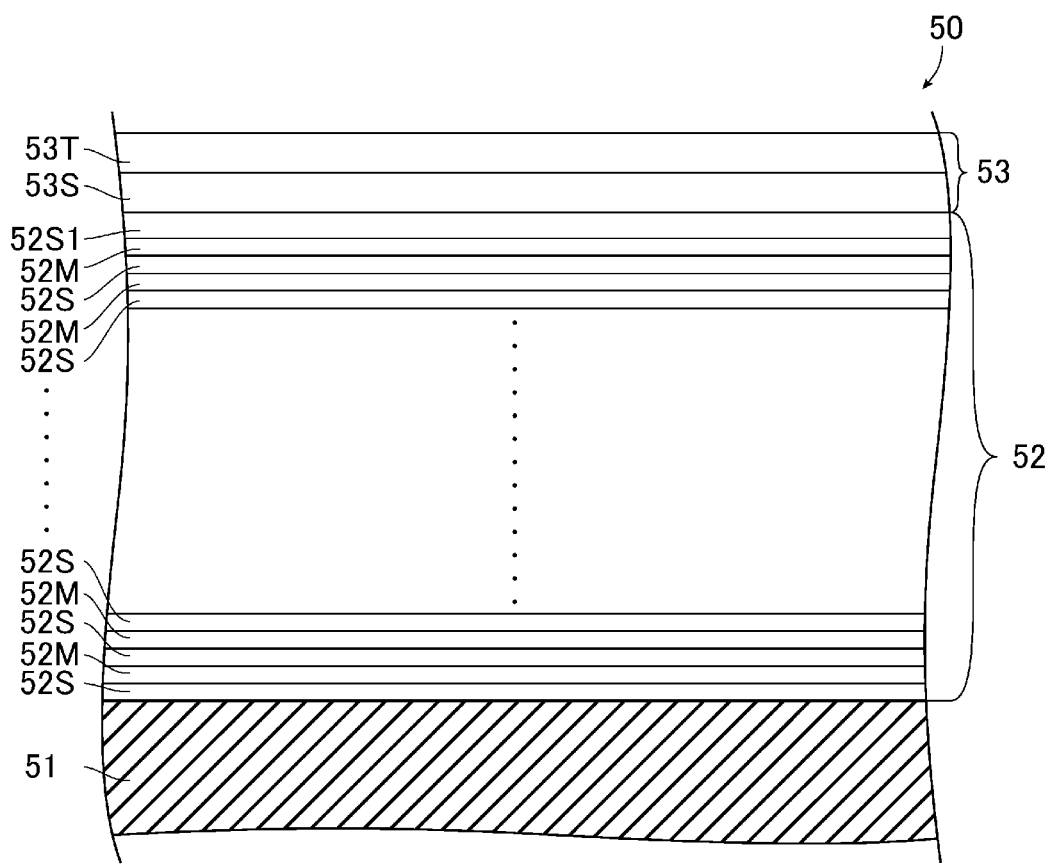
FIG. 3 is a cross-sectional view of an EUV light condensation mirror in a comparative example.

FIG. 3 is a cross-sectional view of the EUV light condensation mirror 50 in the comparative example. As illustrated in FIG. 3, the EUV light condensation mirror 50 includes a substrate 51, a multi-layer reflective film 52, and a protective film 53.

The substrate 51 has a shape substantially same as that of the EUV light condensation mirror 50 illustrated in FIG. 2, and one surface thereof on the reflective surface 55 side is recessed in a substantially spheroid shape. Specifically, the one surface has an elliptical surface shape conjugate to the plasma generation region AR as the first focal point and the intermediate focus point IF as the second focal point different from the first focal point in position. The one surface of the substrate 51 preferably has a surface roughness of 0.3 nm (RMS) or smaller in each region of 1 μm square.

The multi-layer reflective film 52 is provided on the one surface of the substrate 51. In the multi-layer reflective film 52 of the present comparative example, a silicon layer 52S and a molybdenum layer 52M are alternately stacked. The number of layers of the multi-layer reflective film 52 is preferably, for example, 50 to 100. For the EUV light 101 having a wavelength of 13.5 nm, the silicon layer 52S has a real refractive index of 0.99, and the molybdenum layer 52M has a real refractive index of 0.92. The layers included in the multi-layer reflective film 52 may be made of a material other than silicon and molybdenum. In this case, it is preferable that one of the layers has a real refractive index of 0.98 or larger for light having a wavelength of 13.5 nm and the other layer has a refractive index of 0.95 or smaller for light having a wavelength of 13.5 nm.

In the present comparative example, the outermost surface layer of the multi-layer reflective film 52 is the silicon layer 52S and referred to as a first silicon layer 52S1. In the present comparative example, the thickness of the first silicon layer 52S1 is larger than the thickness of any other silicon layer 52S in the multi-layer reflective film 52.

A thickness of each pair of the silicon layer 52S and the molybdenum layer 52M other than the first silicon layer 52S1 in the multi-layer reflective film 52 (i.e. total thickness H of the silicon layer 52S and the molybdenum layer 52M) is, for example, 7.4 nm for the incident angle of 20° when the EUV light 101 has a wavelength of 13.5 nm.

The protective film 53 is provided on the multi-layer reflective film 52. Thus, the protective film 53 contacts the first silicon layer 52S1. The protective film 53 includes an oxide silicon layer 53S and a titanium oxide layer 53T. The oxide silicon layer 53S is provided on the multi-layer reflective film 52, and the titanium oxide layer 53T is provided on the oxide silicon layer 53S. Thus, one surface of the titanium oxide layer 53T is exposed in the internal space of the chamber device 10.

Figure 4:
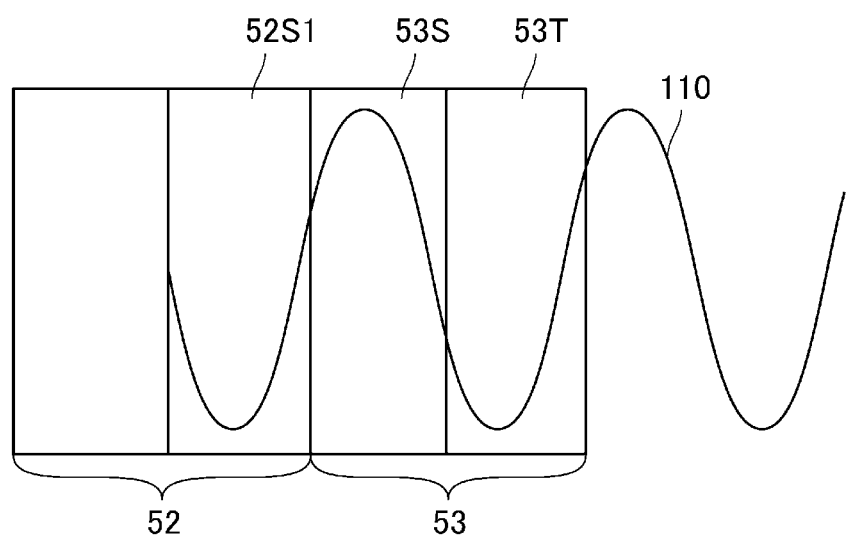
FIG. 4 is a diagram illustrating a protective film and energy of standing wave in the initial state of the EUV light condensation mirror of the comparative example.

FIG. 4 is a diagram illustrating the protective film 53 and energy 110 of standing wave in the initial state of the EUV light condensation mirror 50 of the comparative example. When the EUV light 101 reflects at the multi-layer reflective film 52, standing wave is formed by the EUV light 101 incident on the multi-layer reflective film 52 and the EUV light 101 emitted from the multi-layer reflective film 52. The energy 110 of standing wave is maximum where the amplitude of standing wave is largest, and is minimum where the amplitude of standing wave is smallest.

In the present comparative example, the oxide silicon layer 53S and the titanium oxide layer 53T each have a thickness of 4 nm. Thus, the protective film 53 has a thickness of 8 nm. FIG. 4 illustrates a state in which the reflectance of the EUV light 101 at the reflective surface 55 is maximum. Thus, the EUV light condensation mirror 50 of the present comparative example is initially in a state in which the reflectance is maximum. In this state, the one surface of the titanium oxide layer 53T, which is exposed in the internal space of the chamber device 10, is slightly shifted toward the multi-layer reflective film 52 from a position where the energy 110 of standing wave is highest.

A loss of the EUV light 101 at the reflective surface 55 mainly includes a loss due to interference between light incident on the protective film 53 and light reflected by the protective film 53 and a loss due to absorption of the EUV light 101 by the protective film 53. The reflectance of the EUV light condensation mirror 50 decreases as these losses change through usage. Titanium oxide has higher absorptance for the EUV light 101 than those of oxide silicon, silicon, and molybdenum, and thus the titanium oxide layer 53T preferably does not overlap with a region in which the energy 110 of standing wave is high.

Figure 5:
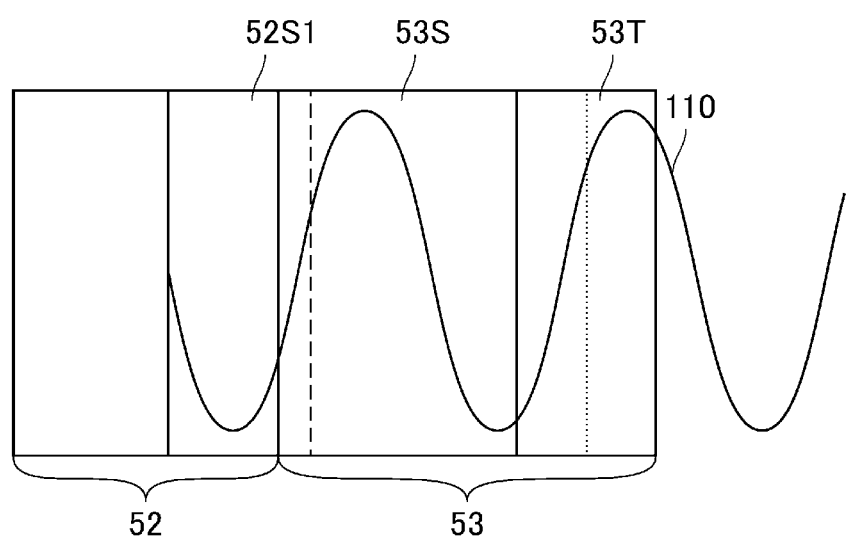
FIG. 5 is a diagram illustrating the protective film of the EUV light condensation mirror of the comparative example after use and the energy of standing wave.

FIG. 5 is a diagram illustrating the protective film 53 and the energy 110 of standing wave in the EUV light condensation mirror 50 of the comparative example after use. When a state after use is described below, the duration of use is, for example, one year. As illustrated in FIG. 5, in the EUV light generation apparatus 100, the thickness of the first silicon layer 52S1 decreases and the thickness of the oxide silicon layer 53S of the protective film 53 increases as the EUV light condensation mirror 50 is used. This can be explained as follows. As the EUV light generation apparatus 100 is used, a slight amount of water remaining in the chamber device 10 is decomposed, and oxygen transmits through the protective film 53 and enters the first silicon layer 52S1. Accordingly, part of silicon in the first silicon layer 52S1 becomes oxide silicon through reaction with the oxygen and becomes part of the oxide silicon layer 53S. Thus, the thickness of the first silicon layer 52S1 decreases and the thickness of the oxide silicon layer 53S increases by the amount of silicon that has become oxide silicon. In addition, the density of oxide silicon is lower than that of silicon, and thus the increase amount of the oxide silicon layer 53S exceeds the decrease amount of the first silicon layer 52S1. Accordingly, the total layer thickness of the first silicon layer 52S1 and the protective film 53 increases as a larger amount of oxygen enters the first silicon layer 52S1. As a result, the titanium oxide layer 53T moves toward a side opposite to the multi-layer reflective film 52 side. In FIG. 5, the position of the boundary between the first silicon layer 52S1 and the oxide silicon layer 53S in the initial state is illustrated with a dashed line, and the position of the one surface of the titanium oxide layer 53T in the initial state is illustrated with a dotted line.

Figure 6:
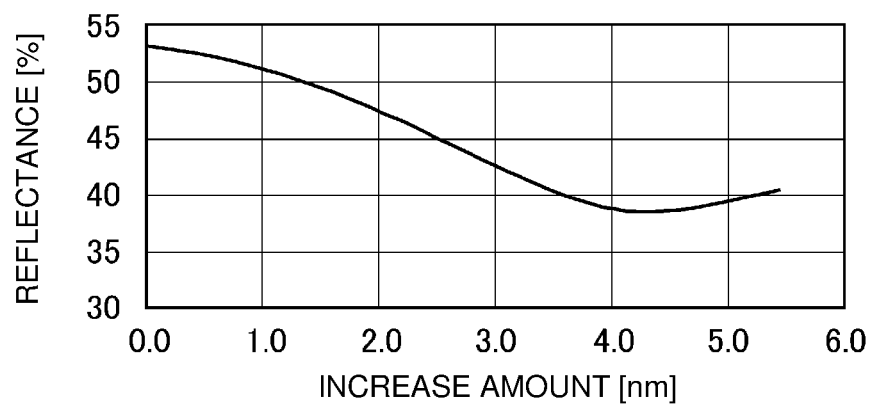
FIG. 6 is a diagram illustrating the relation between the increase amount of the thickness of a first silicon layer and the protective film and the reflectance of the EUV light condensation mirror in the comparative example.

FIG. 6 is a diagram illustrating the relation between the increase amount of the total layer thickness of the first silicon layer 52S1 and the protective film 53 and the reflectance of the EUV light condensation mirror 50 in the comparative example. As the titanium oxide layer 53T moves toward the side opposite to the multi-layer reflective film 52 side as described above, the region in which the energy 110 of standing wave is high overlaps with the titanium oxide layer 53T by a larger amount than in the initial state of the EUV light condensation mirror 50. Accordingly, the protective film 53 further absorbs the EUV light 101 and the loss of the EUV light 101 increases as the EUV light condensation mirror 50 is used. This is the main factor of decrease of the reflectance of the EUV light condensation mirror 50 as illustrated in FIG. 6.

Figure 7:
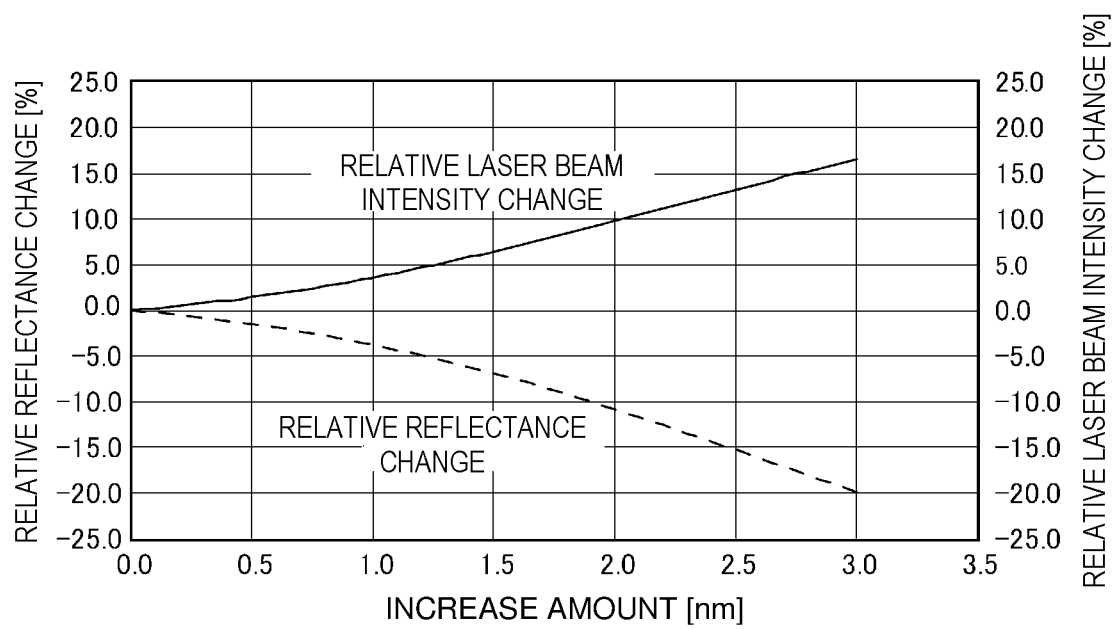
FIG. 7 is a diagram illustrating the relation between change of the reflectance of the EUV light condensation mirror of the comparative example and change of the energy of a laser beam.

FIG. 7 is a diagram illustrating the relation between change of the reflectance of the EUV light condensation mirror 50 and change of the energy 110 of the laser beam 301 with the increase amount of the total layer thickness of the first silicon layer 52S1 and the protective film 53 in the comparative example. In FIG. 7, a dashed line illustrates relative change of the reflectance with respect to the reflectance of the EUV light condensation mirror 50 when the increase amount of the total layer thickness of the first silicon layer 52S1 and the protective film 53 is zero, and a solid line illustrates relative change of the intensity of the laser beam 301 with respect to the energy 110 of the laser beam 301 when the increase amount of the total layer thickness of the first silicon layer 52S1 and the protective film 53 is zero. Hereinafter, a state in which the increase amount of the total layer thickness of the first silicon layer 52S1 and the protective film 53 is zero is also referred to as the initial state. The power of the EUV light 101 incident on the exposure apparatus 200 preferably has a small range of change. Thus, as illustrated in FIG. 7, the power of the laser beam 301 emitted from the laser apparatus LD and incident on the droplet DL is increased as the reflectance of the EUV light condensation mirror 50 decreases along with use of the EUV light generation apparatus 100. For example, when the layer thickness increases by 3 nm from the initial state, the power of the laser beam 301 is increased by 15% from the initial state. In this manner, the power of the EUV light 101 radiated from the plasma generation region AR is increased to prevent decrease of the power of the EUV light 101 emitted from the EUV light generation apparatus 100.

4.2 Problem

As the power of the laser beam 301 with which the droplet DL is irradiated is increased, the energy of ions and neutral particles scattered by the droplet DL and the energy of light radiated by the droplet DL increase. Accordingly, the speed of degradation of the protective film 53 increases as the power of the laser beam 301 with which the droplet DL is irradiated is increased, and as a result, the lifetime of the EUV light condensation mirror 50 is shortened.

Thus, the embodiment below exemplarily describes an EUV light condensation mirror, the lifetime of which can be prevented from being shortened.

5. Description of EUV Light Condensation Mirror of Embodiment 1

The following describes the configuration of a EUV light condensation mirror of Embodiment 1. A component identical to that described above is denoted by an identical reference sign, and duplicate description thereof will be omitted unless specifically stated.

5.1 Configuration

Figure 8:
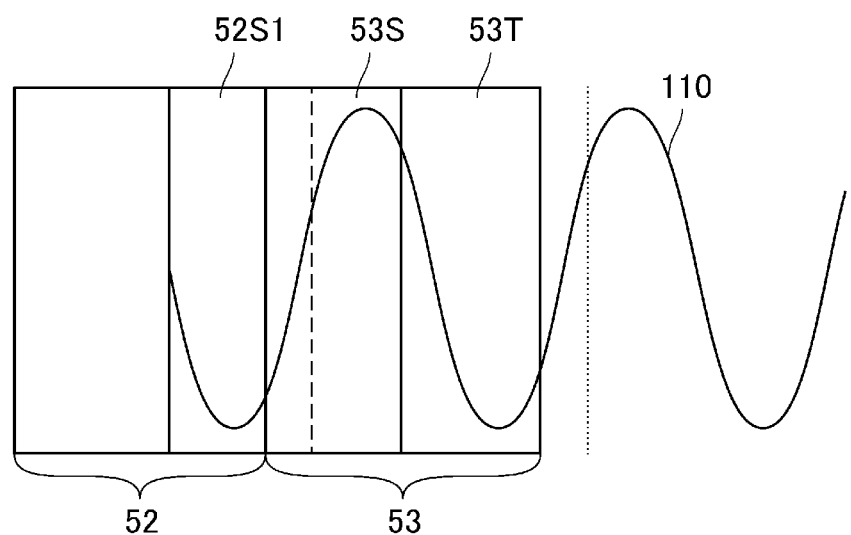
FIG. 8 is a diagram illustrating the protective film and the energy of standing wave in the initial state of the EUV light condensation mirror of Embodiment 1.

FIG. 8 is a diagram illustrating the protective film 53 and the energy 110 of standing wave in the initial state of the EUV light condensation mirror 50 according to the present embodiment. The EUV light condensation mirror 50 according to the present embodiment is different from the EUV light condensation mirror 50 of the comparative example in that the thickness of the first silicon layer 52S1 is smaller than the thickness of the first silicon layer 52S1 of the comparative example. Accordingly, the reflectance of the EUV light condensation mirror 50 according to the present embodiment in the initial state is lower than the reflectance of the EUV light condensation mirror 50 of the comparative example in the initial state. In FIG. 8, the position of the boundary between the first silicon layer 52S1 and the oxide silicon layer 53S of the comparative example in the initial state is illustrated with a dashed line, and the position of the one surface of the titanium oxide layer 53T of the comparative example in the initial state is illustrated with a dotted line. The reflectance of the EUV light condensation mirror 50 of the example illustrated in FIG. 8 is lower than the reflectance of the EUV light condensation mirror 50 of the comparative example in the initial state illustrated in FIG. 4 by 5%. In this case, when the reflectance of the EUV light condensation mirror 50 illustrated in FIG. 4 is, for example, 53.2%, the reflectance of the EUV light condensation mirror 50 of the example illustrated in FIG. 8 is 50.54%, which is 2.66% as 5% of 53.2% lower.

Figure 9:
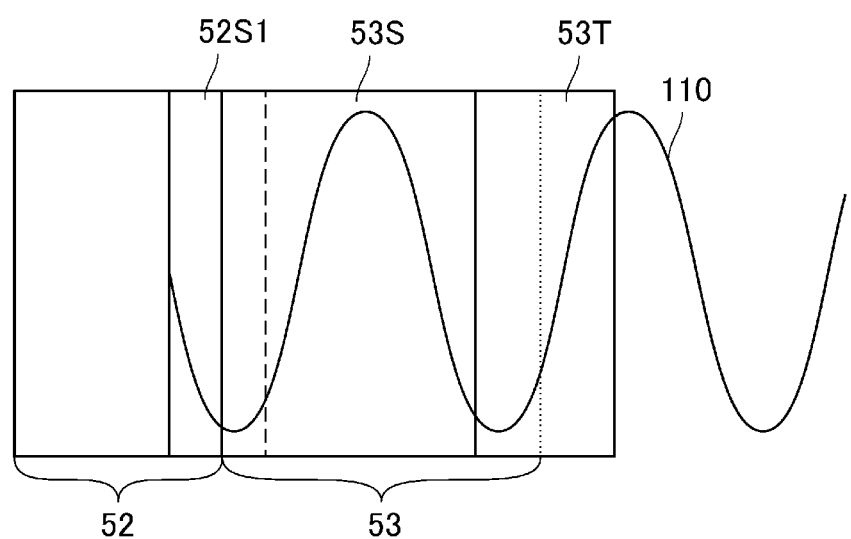
FIG. 9 is a diagram illustrating the protective film of the EUV light condensation mirror of Embodiment 1 after use and the energy of standing wave.

FIG. 9 is a diagram illustrating the protective film 53 and the energy 110 of standing wave in the EUV light condensation mirror 50 according to the present embodiment after use. As illustrated in FIG. 9, in the EUV light condensation mirror 50 according to the present embodiment as well, similarly to the EUV light condensation mirror 50 of the comparative example, the total thickness of the first silicon layer 52S1 and the protective film 53 increases as a larger amount of oxygen enters the first silicon layer 52S1. In FIG. 9, the position of the boundary between the first silicon layer 52S1 and the oxide silicon layer 53S, which is illustrated in FIG. 8, is illustrated with a dashed line, and the position of the one surface of the titanium oxide layer 53T, which is illustrated in FIG. 8, is illustrated with a dotted line. In this manner, the titanium oxide layer 53T moves toward the side opposite to the multi-layer reflective film 52 side. The reflectance of the EUV light condensation mirror 50 in the state illustrated in FIG. 9 is, for example, equal to the reflectance of the EUV light condensation mirror 50 in the state illustrated in FIG. 8. However, the reflectance of the EUV light condensation mirror 50 changes as the EUV light condensation mirror 50 transitions from the state of FIG. 8 to the state of FIG. 9.

Figure 10:
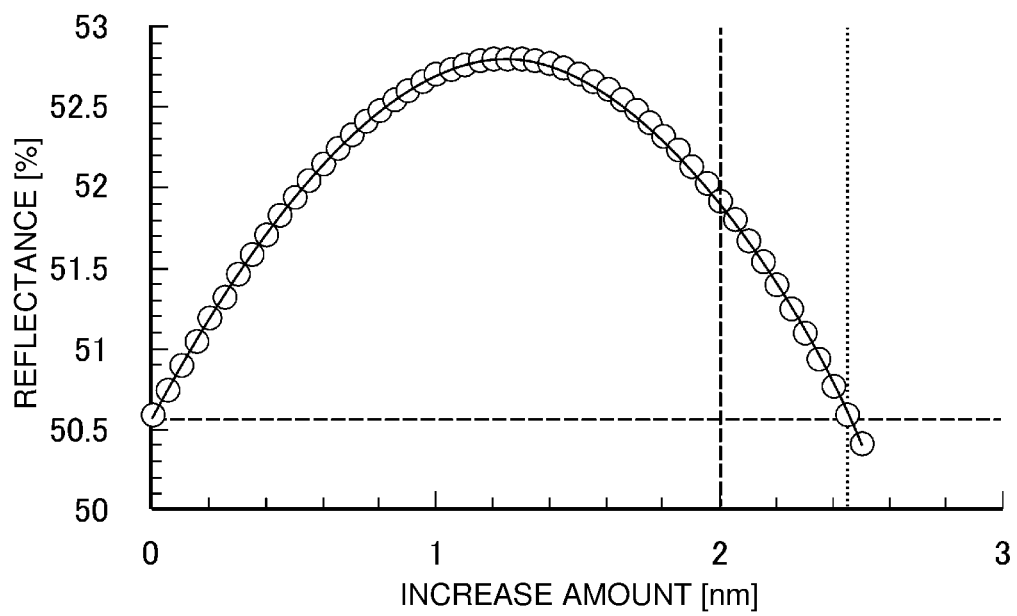
FIG. 10 is a diagram illustrating the relation between the increase amount of the thickness of the first silicon layer and the protective film and the reflectance of the EUV light condensation mirror in Embodiment 1.

The following describes change of the reflectance of the EUV light condensation mirror 50 according to the present embodiment. FIG. 10 is a diagram illustrating the relation between the increase amount of the total layer thickness of the first silicon layer 52S1 and the protective film 53 in the present embodiment and the reflectance. Each point illustrated with a circle indicates calculated reflectance, and a solid line illustrates its approximate curve. As described above, the total layer thickness of the first silicon layer 52S1 and the protective film 53 increases based on the amount of oxygen that reacts with the first silicon layer 52S1 until the initial state illustrated in FIG. 8 reaches the after-use state illustrated in FIG. 9. As illustrated in FIG. 10, the reflectance increases along with this thickness increase and then decreases in the EUV light condensation mirror 50 according to the present embodiment. The thickness increase amount of the first silicon layer 52S1 and the protective film 53 during this process is substantially 2.45 nm. However, when the reflectance is maximum at 52.7%, the position of the surface of the protective film 53 is slightly different from the position of the protective film 53 illustrated in FIG. 4, and the reflectance is slightly lower than the reflectance of the EUV light condensation mirror 50 in the initial state illustrated in FIG. 4. This is because part of the first silicon layer 52S1 reacts with oxygen when the reflectance of the EUV light condensation mirror 50 is maximum in the present embodiment. Thus, in this state of the first silicon layer 52S1 and the protective film 53, the thickness of the oxide silicon layer 53S is larger than the initial thickness of the oxide silicon layer 53S unlike in the state of the first silicon layer 52S1 and the protective film 53 illustrated in FIG. 4. Accordingly, even when the initial reflectance of the EUV light condensation mirror 50 according to the present embodiment is lower than the initial reflectance of the EUV light condensation mirror 50 of the comparative example by 5%, the range of change of the reflectance is smaller than 5% until the reflectance of the EUV light condensation mirror 50 according to the present embodiment becomes maximum. Thus, the range of change of the reflectance is smaller than 5% until the initial state illustrated in FIG. 8 reaches the after-use state illustrated in FIG. 9. However, with the EUV light condensation mirror 50 of the comparative example, the reflectance decreases by substantially 8% when the total layer thickness of the first silicon layer 52S1 and the protective film 53 increases by substantially 2.45 nm as illustrated in FIG. 6. Thus, the initial reflectance of the EUV light condensation mirror 50 decreases by substantially 15%. In other words, with the EUV light condensation mirror 50 of the comparative example, the reflectance changes 5% or more of that in the initial state when the increase amount of the total layer thickness of the first silicon layer 52S1 and the protective film 53 is substantially 1.2 nm or larger as illustrated in FIG. 6. Thus, when the EUV light condensation mirror 50 according to the present embodiment and the EUV light condensation mirror 50 of the comparative example are used under the same condition for the same time, the change amount of the reflectance is smaller for the EUV light condensation mirror 50 according to the present embodiment.

Figure 11:
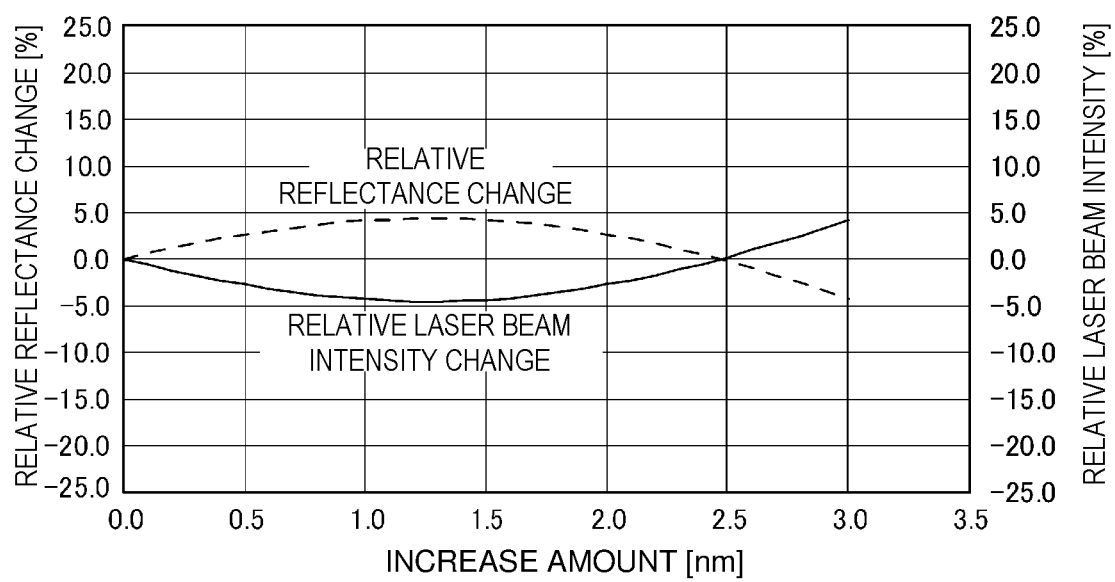
FIG. 11 is a diagram illustrating the relation between change of the reflectance and change of the energy of a laser beam in Embodiment 1.

FIG. 11 is a diagram illustrating the relation between change of the reflectance of the EUV light condensation mirror 50 and change of the energy 110 of the laser beam 301 with the increase amount of the total layer thickness of the first silicon layer 52S1 and the protective film 53 in the present embodiment. In FIG. 11, a dashed line illustrates relative change of the reflectance with respect to the reflectance of the EUV light condensation mirror 50 when the increase amount of the total layer thickness of the first silicon layer 52S1 and the protective film 53 is zero, and a solid line illustrates relative change of the intensity of the laser beam 301 with respect to the energy 110 of the laser beam 301 when the increase amount of the total layer thickness of the first silicon layer 52S1 and the protective film 53 is zero. The power of the laser beam 301 with which the droplet DL is irradiated is changed in accordance with change of the reflectance of the EUV light condensation mirror 50 to prevent change of the power of the EUV light 101 emitted from the EUV light generation apparatus 100 as described above. However, with the EUV light condensation mirror 50 according to the present embodiment, change of the reflectance can be reduced as compared to the EUV light condensation mirror 50 of the comparative example, and thus change of the power of the laser beam 301 can be reduced as compared to change of the power of the laser beam 301 illustrated in FIG. 7. For example, when the EUV light condensation mirror 50 is used until the layer thickness increases by 3 nm from the initial state, change of the power of the laser beam 301 is prevented to the range of ±5% with respect to the reflectance in the initial state.

In this manner, the thickness increase amount of the first silicon layer 52S1 and the protective film 53 of the EUV light condensation mirror 50 according to the present embodiment can be increased than that of the EUV light condensation mirror 50 of the comparative example in a case of use in which the reflectance changes by 5% or less of the maximum reflectance of the EUV light condensation mirror 50. Thus, the lifetime of the EUV light condensation mirror 50 according to the present embodiment can be increased as compared to that of the EUV light condensation mirror 50 of the comparative example.

The following describes a configuration with which the range of change of the reflectance of the EUV light condensation mirror 50 is 5% or less.

Figure 12:
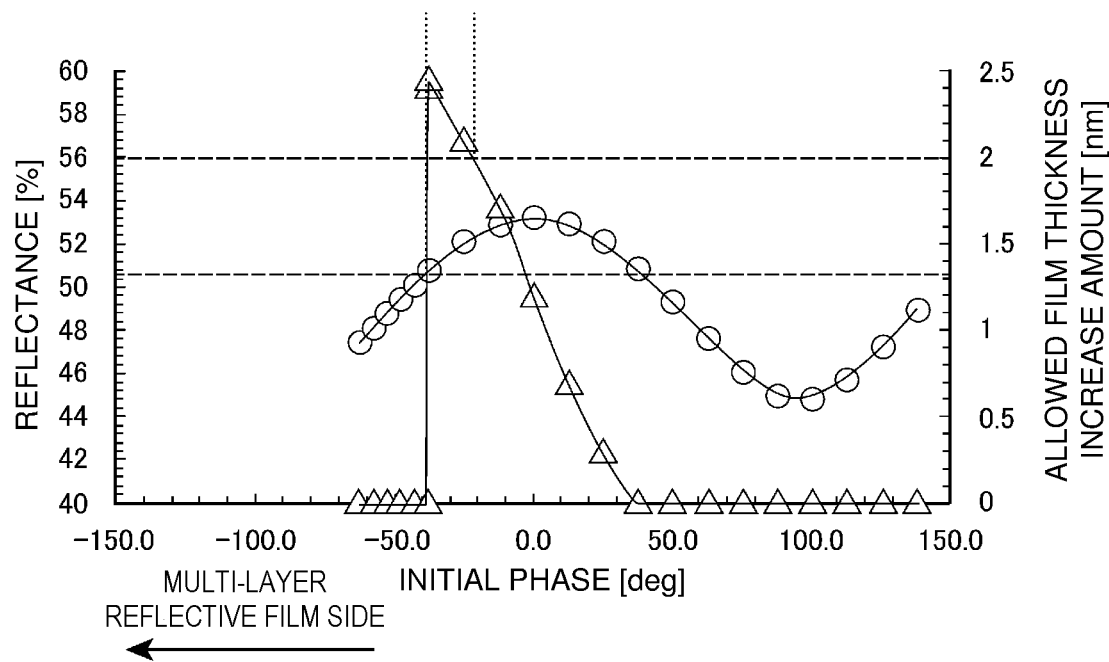
FIG. 12 is a diagram illustrating the relation among the position of a surface of the protective film in the phase of standing wave in the initial state, the reflectance in the initial state, and the allowed thickness increase amount of the first silicon layer and the protective film in Embodiment 1.

FIG. 12 is a diagram illustrating the relation among the position of the surface of the protective film 53 in the phase of standing wave in the initial state, the reflectance in the initial state, and an allowed increase amount of the total layer thickness of the first silicon layer 52S1 and the protective film 53 in the present embodiment. In FIG. 12, each point illustrated with a circle illustrates calculated reflectance in the initial state, and each point illustrated with a triangle illustrates a calculated allowed increase amount of the total layer thickness of the first silicon layer 52S1 and the protective film 53. Each solid line illustrates an approximate curve of the circles or triangles. In the following description, the position of the surface of the protective film 53 in the phase of standing wave in the initial state is also referred to as an initial phase.

As illustrated in FIG. 12, the reflectance of the EUV light 101 in the initial state is maximum when the initial phase position is 0.0°. This state is the state illustrated in FIG. 4. In the following description, the reflectance in the initial state is also referred to as an initial maximum reflectance. In the present embodiment, the position of the surface of the protective film 53 at the initial maximum reflectance is determined as a position where the phase of standing wave of the EUV light 101 is 0°. The multi-layer reflective film 52 side is defined to be a negative side with reference to the position of 0°. FIG. 12 illustrates a case in which the thickness of each of the oxide silicon layer 53S and the titanium oxide layer 53T of the protective film 53 is 4 nm in a region in which the incident angle of the EUV light 101 on the reflective surface 55 is 20°. The position of the one surface of the titanium oxide layer 53T as the surface of the protective film 53 is adjusted by the thickness of the first silicon layer 52S1. Accordingly, the position of the one surface of the titanium oxide layer 53T is positioned on the negative side in the phase of standing wave when the thickness of the first silicon layer 52S1 is reduced as compared to the state of FIG. 4 in which the phase of the one surface of the titanium oxide layer 53T is positioned at 0.0°.

As illustrated in FIG. 12, the phase of the one surface of the titanium oxide layer 53T is 0.0°, and the initial maximum reflectance is 53.2%. The reflectance decreases by 2.66%, which is 5% of the initial maximum reflectance, and becomes 50.54% at the phase of −37.7° on the negative side. This state is the state of FIG. 8. Thus, when the thickness of the first silicon layer 52S1 is further reduced and the initial phase is equal to or smaller than −37.7°, the initial reflectance decreases by 5% or more as compared to the initial maximum reflectance.

Each point illustrated with a circle corresponds to the reflectance in the initial state as described above. Thus, when the position of the one surface of the titanium oxide layer 53T moves toward the positive side in the phase of standing wave as the EUV light condensation mirror 50 is used, change of the reflectance does not trace the circles.

The allowed thickness increase amount illustrated with the triangles is the increase amount of the total layer thickness of the first silicon layer 52S1 and the protective film 53 until the reflectance decreases by 5% as compared to the initial maximum reflectance as the EUV light condensation mirror 50 is used. In the following description, this increase amount is also referred to as an allowed film thickness increase amount. In the case of FIG. 8, the reflectance does not decrease by 5% or more as compared to the initial maximum reflectance until the thickness increase amount of the first silicon layer 52S1 and the protective film 53 becomes substantially 2.5 nm as the EUV light condensation mirror 50 is used. Thus, in the case of FIG. 8, the allowed film thickness increase amount is substantially 2.5 nm. However, in the case of FIG. 4, the allowed film thickness increase amount is substantially 1.2 nm. In addition, as illustrated in FIG. 12, the initial phase is −37.7° to −26.8° when the allowed film thickness increase amount is equal to or larger than 2 nm. With the allowed film thickness increase amount equal to or larger than 2 nm, the EUV light generation apparatus 100 can be used, for example, for one year without replacing the EUV light condensation mirror 50.

In FIG. 12, the allowed film thickness increase amount is indicated as zero when the reflectance is lower than the initial maximum reflectance by 5% or more in the initial state.

The following describes the initial phase when the thickness of the titanium oxide layer 53T is to be changed.

Figure 13:
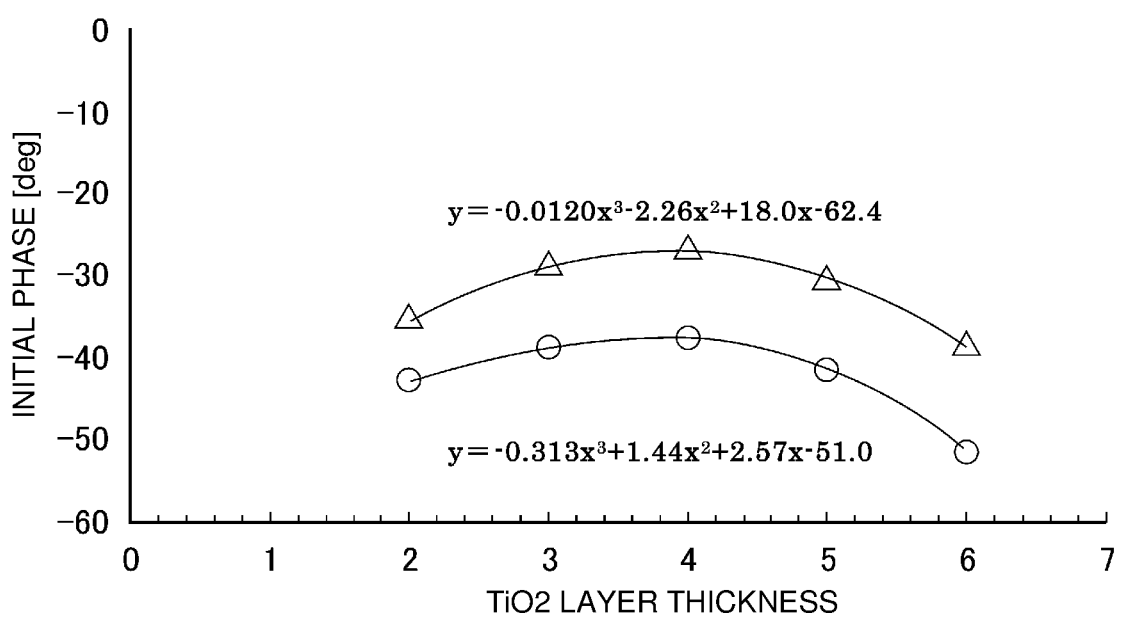
FIG. 13 is a diagram illustrating the relation between the thickness of a titanium oxide layer and the position of the surface of the protective film in the phase of standing wave in the initial state.

FIG. 13 is a diagram illustrating the relation between the thickness of the titanium oxide layer 53T and the initial phase. FIG. 13 illustrates a case in which the protective film 53 has a thickness of 8 nm in the region in which the incident angle of the EUV light 101 on the reflective surface 55 is 20°. In FIG. 13, the initial phase when the reflectance is lower than the initial maximum reflectance by 5% is illustrated with a circle for each 1 nm of the thickness of the titanium oxide layer 53T between 2 nm and 6 nm inclusive. When x represents the thickness of the titanium oxide layer 53T and y represents the initial phase at each circle, y is expressed as Expression (1) below by using x through fitting by a least-square method.

$$y = -0.313x^3 + 1.44x^2 + 2.57x - 51.0 \quad (1)$$

As understood from FIG. 12, a lifetime longer than that of the EUV light condensation mirror 50 having the maximum reflectance in the initial state can be obtained when the initial phase is smaller than 0°. Thus, when y satisfies Expression (2) below, the EUV light condensation mirror 50 can maintain, for a long time, a state in which the reflectance is equal to or more than the reflectance lower than the initial maximum reflectance of the EUV light condensation mirror 50 by 5%.

$$-0.313x^3 + 1.44x^2 + 2.57x - 51.0 \leq y < 0 \quad (2)$$

The following describes a condition when the allowed film thickness increase amount is larger than 2 nm. In FIG. 13, the initial phase when the allowed film thickness increase amount is larger than 2 nm is illustrated with a triangle for each of the thickness of the titanium oxide layer 53T between 2 nm and 6 nm inclusive. When y represents the initial phase at each triangle, y is expressed as Expression (3) below by using x through fitting by the least-square method.

$$y = -0.0120x^3 - 2.26x^2 + 18.0x - 62.4 \quad (3)$$

Thus, when the phase y of standing wave at the position of the surface of the protective film 53 in the initial state satisfies Expression (4) below, the EUV light condensation mirror 50 has a reflectance higher than the initial maximum reflectance by 5% or more and an allowed film thickness increase amount larger than 2 nm.

$$-0.313x^3 + 1.44x^2 + 2.57x - 51.0 \leq y < -0.0120x^3 - 2.26x^2 + 18.0x - 62.4 \quad (4)$$

Thus, when the initial phase reflectance satisfies Expression (4), the EUV light generation apparatus 100 can be used, for example, for one year without replacing the EUV light condensation mirror 50 while the reflectance is not lower than the initial maximum reflectance of the EUV light condensation mirror 50 by 5% or more.

The protective film 53 needs to have a thickness of 8 nm as described above only in the region in which the incident angle of the EUV light 101 is 20°, and the protective film 53 may have a thickness equal to other than 8 nm in the other region. For example, the thickness of the protective film 53 on the center side of the reflective surface 55 of the EUV light condensation mirror 50 is preferably equal to or larger than the thickness of the protective film 53 on the outer periphery side.

5.2 Effect

As described above, in the EUV light condensation mirror 50 according to the present embodiment, the protective film 53 includes the oxide silicon layer 53S provided on the multi-layer reflective film 52, and the titanium oxide layer 53T that is provided on the oxide silicon layer 53S and one surface of which is exposed. When x represents the thickness of the titanium oxide layer 53T and the phase of standing wave of the EUV light 101 at the position of the one surface of the titanium oxide layer 53T when the reflectance of the EUV light 101 is maximum is defined to be zero, the position of the one surface is a position at which the phase y of standing wave satisfies Expression (3) above. Thus, the state in which the reflectance is equal to or more than the reflectance lower than the initial maximum reflectance of the EUV light condensation mirror 50 by 5% can be maintained for a long time as compared to the EUV light condensation mirror 50 of the comparative example.

In addition, when Expression (4) above is satisfied, the EUV light condensation mirror 50 according to the present embodiment can be used, for example, for one year without replacement while the reflectance is not lower than the initial maximum reflectance of the EUV light condensation mirror 50 by 5% or more.

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious for those skilled in the art that embodiments of the present disclosure would be appropriately combined.

The terms used throughout the present specification and the appended claims should be interpreted as non-limiting terms, unless otherwise specified. For example, terms such as "comprise", "include", "have", and "contain" should not be interpreted to be exclusive of other structural elements. Further, indefinite articles "a/an" described in the present specification and the appended claims should be interpreted to mean "at least one" or "one or more". Further, "at least one of A, B, and C" should be interpreted to mean any of A, B, C, A+B, A+C, B+C, and A+B+C as well as to include combinations of the any thereof and any other than A, B, and C.

What is claimed is:
1. An extreme ultraviolet light condensation mirror comprising:
   a substrate;

a multi-layer reflective film provided on the substrate and configured to reflect extreme ultraviolet light having a wavelength of 13.5 nm; and a protective film provided on the multi-layer reflective film, the protective film including an oxide silicon layer provided on the multi-layer reflective film and a titanium oxide layer that is provided on the oxide silicon layer and one surface of which is exposed, when x represents a thickness of the titanium oxide layer, a phase of standing wave of the extreme ultraviolet light at the position of the one surface at time of a reflectance of the extreme ultraviolet light being maximum is defined to be zero, and a direction from the one surface toward the multi-layer reflective film is defined to be negative, a position of the one surface being a position at which the phase of standing wave, which is represented by y, satisfies the expression:

$$-0.313x^3+1.44x^2+2.57x-51.0 \le y<0.$$

2. The extreme ultraviolet light condensation mirror according to claim 1, wherein
the protective film has a thickness of 8 nm.

3. The extreme ultraviolet light condensation mirror according to claim 2, wherein
a thickness of a layer of the multi-layer reflective film is a thickness with which the position of the one surface satisfies the expression, the layer contacting the protective film.

4. The extreme ultraviolet light condensation mirror according to claim 3, wherein
in a region in which the extreme ultraviolet light is incident at an angle of 20°, the position of the one surface is a position at which the phase y of the standing wave satisfies the expression:

$$y \le -0.120x^3-2.26x^2+18.0x-62.4.$$

5. The extreme ultraviolet light condensation mirror according to claim 1, wherein
for light having a wavelength of 13.5 nm, a layer having a real refractive index of 0.98 or larger and a layer having a real refractive index of 0.95 or smaller are alternately stacked in the multi-layer reflective film.

6. The extreme ultraviolet light condensation mirror according to claim 5, wherein
the layer having a real refractive index of 0.98 or larger is a silicon layer, and the layer having a real refractive index of 0.95 or smaller is a molybdenum layer.

7. The extreme ultraviolet light condensation mirror according to claim 6, wherein
a layer of the multi-layer reflective film is a silicon layer, the layer contacting the protective film.

8. The extreme ultraviolet light condensation mirror according to claim 1, wherein
the multi-layer reflective film includes 50 to 100 layers.

9. The extreme ultraviolet light condensation mirror according to claim 1, wherein
a thickness of the protective film on a center side of the extreme ultraviolet light condensation mirror is equal to or larger than a thickness of the protective film on an outer periphery side of the extreme ultraviolet light condensation mirror.

10. The extreme ultraviolet light condensation mirror according to claim 1, wherein
a surface of the substrate, on which the multi-layer reflective film is provided, has an elliptical surface shape conjugate to a first focal point and a second focal point different from the first focal point in position.

11. The extreme ultraviolet light condensation mirror according to claim 1, wherein
a surface of the substrate, on which the multi-layer reflective film is provided, has a surface roughness of 0.3 nm (RMS) or smaller in each region of 1 μm square.

12. An extreme ultraviolet light generation apparatus comprising:
a chamber having an internal space in which a laser beam is condensed and plasma is generated from a target substance at a focusing position of the laser beam; and
an extreme ultraviolet light condensation mirror configured to condense extreme ultraviolet light radiated from the plasma of the target substance,
the extreme ultraviolet light condensation mirror including:
a substrate;
a multi-layer reflective film provided on the substrate and configured to reflect extreme ultraviolet light having a wavelength of 13.5 nm; and
a protective film provided on the multi-layer reflective film,
the protective film including an oxide silicon layer provided on the multi-layer reflective film and a titanium oxide layer that is provided on the oxide silicon layer and one surface of which is exposed,
when x represents a thickness of the titanium oxide layer, a phase of standing wave of the extreme ultraviolet light at the position of the one surface at time of a reflectance of the extreme ultraviolet light being maximum is defined to be zero, and a direction from the one surface toward the multi-layer reflective film is defined to be negative, a position of the one surface being a position at which the phase of standing wave, which is represented by y, satisfies the expression:

$$-0.313x^3+1.44x^2+2.57x-51.0 \le y<0.$$

13. An electronic device manufacturing method comprising:
generating extreme ultraviolet light by an extreme ultraviolet light generation apparatus;
outputting the extreme ultraviolet light to an exposure apparatus; and
exposing a photosensitive substrate to the extreme ultraviolet light in the exposure apparatus to manufacture an electronic device,
the extreme ultraviolet light generation apparatus including:
a chamber having an internal space in which a laser beam is condensed and plasma is generated from a target substance at a focusing position of the laser beam; and
an extreme ultraviolet light condensation mirror configured to condense extreme ultraviolet light radiated from the plasma of the target substance,
the extreme ultraviolet light condensation mirror including:
a substrate;
a multi-layer reflective film provided on the substrate and configured to reflect extreme ultraviolet light having a wavelength of 13.5 nm; and
a protective film provided on the multi-layer reflective film,
the protective film including an oxide silicon layer provided on the multi-layer reflective film and a titanium oxide layer that is provided on the oxide silicon layer and one surface of which is exposed, when x represents a thickness of the titanium oxide layer, a phase of standing wave of the extreme ultraviolet light at the position of the one surface at time of a reflectance of the extreme ultraviolet light being maximum is defined to be zero, and a direction from the one surface toward the multi-layer reflective film is defined to be negative, a position of the one surface being a position at which the phase of standing wave, which is represented by y, satisfies the expression:

$-0.313x^3+1.44x^2+2.57x-51.0 \leq y < 0$.

* * * * *